(12) United States Patent
Patalay et al.

(10) Patent No.: US 7,964,038 B2
(45) Date of Patent: Jun. 21, 2011

(54) APPARATUS FOR IMPROVED AZIMUTHAL THERMAL UNIFORMITY OF A SUBSTRATE

(75) Inventors: Kailash Kiran Patalay, Santa Clara, CA (US); Jean R. Vatus, San Jose, CA (US); Dean Berlin, College Park, MD (US)

(73) Assignee: Applied Materials, Inc., Santa Clara, CA (US)

( * ) Notice: Subject to any disclaimer, the term of this patent is extended or adjusted under 35 U.S.C. 154(b) by 167 days.

(21) Appl. No.: 12/244,604

(22) Filed: Oct. 2, 2008

(65) Prior Publication Data

US 2010/0086784 A1 Apr. 8, 2010

(51) Int. Cl.
*C23C 16/00* (2006.01)
(52) U.S. Cl. .................. 118/728; 257/E23.06; 118/729; 118/730
(58) Field of Classification Search .................. 257/675, 257/678, E23.026; 118/728–730
See application file for complete search history.

(56) References Cited

U.S. PATENT DOCUMENTS

| 5,044,943 | A | | 9/1991 | Bowman et al. |
| 6,156,079 | A | * | 12/2000 | Ho et al. ....................... 29/25.01 |
| 6,599,815 | B1 | * | 7/2003 | Yang ............................. 438/471 |
| 2001/0026012 | A1 | * | 10/2001 | Minamitani et al. .......... 257/678 |
| 2003/0015141 | A1 | | 1/2003 | Takagi |
| 2005/0092439 | A1 | | 5/2005 | Keeton et al. |
| 2009/0098280 | A1 | * | 4/2009 | Tahon ............................. 427/69 |

* cited by examiner

*Primary Examiner* — Michelle Estrada
(74) *Attorney, Agent, or Firm* — Alan Taboada; Moser IP Law Group

(57) ABSTRACT

Methods and apparatus for providing an improved azimuthal thermal uniformity of a substrate are provided herein. In some embodiments, a substrate support for use in a semiconductor process chamber includes a susceptor plate; and a supporting member to support a backside of the susceptor plate proximate an outer edge thereof, wherein the supporting member substantially covers the backside of the susceptor plate. In some embodiments, the substrate support is disposed in a process chamber having at least some lamps disposed below the supporting member and utilized for heating the back side of the susceptor plate.

16 Claims, 4 Drawing Sheets

APPARATUS FOR IMPROVED AZIMUTHAL THERMAL UNIFORMITY OF A SUBSTRATE

BACKGROUND OF THE INVENTION

1. Field of the Invention

Embodiments of the present invention generally relate to semiconductor processing equipment.

2. Description of the Related Art

In some semiconductor processes such as deposition, the substrate may be heated from the back side thereof to provide and maintain a desired temperature of the substrate surface. For example, a radiant light source such as heating lamps may be disposed below the substrate support and utilized to radiate the back side of a susceptor plate having the substrate disposed thereupon.

Unfortunately, with conventional substrate supports, radiant energy from the light source must traverse the components of the substrate support such as a plurality of supporting brackets which support the susceptor plate, or a plurality of lift pins used to raise and lower the substrate, prior to reaching the back side of the susceptor plate. For example, the supporting brackets can cast a thermal shadow on the back side of the susceptor plate, thus creating localized regions of lower temperature on the substrate. In addition, the differing thermal characteristics of the lift pins can result in localized regions of varying temperature on the substrate. Such non-uniform temperature profiles on the substrate can undesirably result in non-uniform thickness of a layer deposited on the substrate in many processes which are temperature dependent.

Thus, there is a need in the art for improved methods and apparatus for providing azimuthal temperature uniformity across a substrate surface.

SUMMARY OF THE INVENTION

Methods and apparatus for providing an improved azimuthal thermal uniformity of a substrate are provided herein. In some embodiments, a substrate support for use in a semiconductor process chamber includes a susceptor plate; and a supporting member to support a backside of the susceptor plate proximate an outer edge thereof, wherein the supporting member substantially covers the backside of the susceptor plate. In some embodiments, the substrate support is disposed in a process chamber having at least some lamps disposed below the supporting member and utilized for heating the back side of the susceptor plate.

In some embodiments, an apparatus for processing a substrate may include a process chamber; and a substrate support disposed within the process chamber, the substrate support including a susceptor plate; and a supporting member to support a backside of the susceptor plate proximate an outer edge thereof, wherein the supporting member substantially covers the backside of the susceptor plate.

In some embodiments, a method of deposition a layer on a substrate may include (a) providing first substrate disposed atop a substrate support having a set of first lift pins; (b) depositing a layer atop the first substrate using a first process; (c) measuring a profile of the layer proximate a location of each first lift pin; and (d) replacing the set of first lift pins with a set of second lift pins when the profile of the layer is outside of a desired tolerance, wherein the set of second lift pins have thermal characteristics different than the set of first lift pins. In some embodiments, steps (a)-(c) are repeated with a second substrate, wherein the set of second lift pins may be replaced with a set of third lift pins when the profile of the layer is outside of a desired tolerance.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

Figure 1:
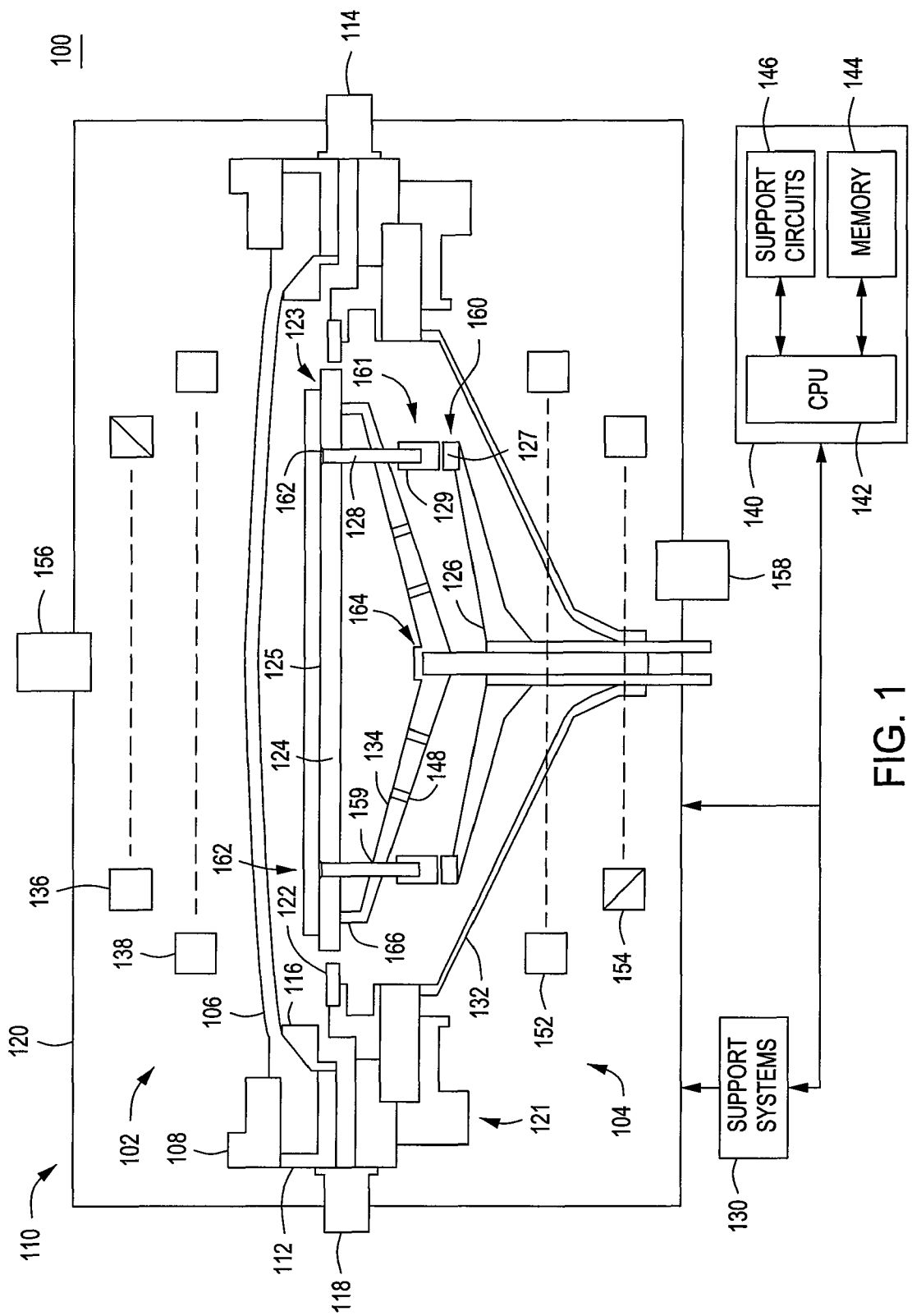
FIG. 1 depicts a schematic side view of a process chamber in accordance with some embodiments of the present invention.

Methods and apparatus for providing an improved azimuthal thermal uniformity of a substrate are provided herein. The inventive apparatus may include a substrate support having a conical supporting member which may advantageously provide improved azimuthal temperature uniformity across a susceptor plate. Thus, azimuthal temperature uniformity across the substrate surface is improved, which may result in improved uniformity of a layer deposited on the substrate surface. In addition, inventive methods for configuring the substrate support are provided which may advantageously reduce local temperature non-uniformities in the substrate proximate the location of each lift pin.

The inventive methods and apparatus disclosed herein may be performed in any suitable process chamber adapted for performing substrate processing that is temperature dependent and wherein radiant heat is directed towards a bottom of a substrate support. One such suitable process chamber is the RP EPI® reactor, available from Applied Materials, Inc. of Santa Clara, Calif. The RP EPI® reactor may perform epitaxial silicon deposition processes. An exemplary process chamber is described below with respect to FIG. 1, which depicts a schematic, cross-sectional view of a semiconductor substrate process chamber 100 in accordance with embodiments of the present invention and further suitable for performing processes in accordance with embodiments of the present invention. The process chamber 100 may be adapted for performing epitaxial silicon deposition processes or any other suitable deposition process and illustratively comprises a chamber body 110, support systems 130, and a controller 140.

The chamber body 110 generally includes an upper portion 102, a lower portion 104, and an enclosure 120. The upper portion 102 is disposed on the lower portion 104 and includes a lid 106, a clamp ring 108, a liner 116, a baseplate 112, one or more upper lamps 136 and one or more lower lamps 138, and an upper pyrometer 156. In one embodiment, the lid 106 has a dome-like form factor, however, lids having other form factors (e.g., flat or reverse curve lids) are also contemplated. The lower portion 104 is coupled to a process gas intake port 114 and an exhaust port 118 and comprises a baseplate assembly 121, a lower dome 132, a substrate support 123, a pre-heat ring 122, one or more upper lamps 152 and one or more lower lamps 154, and a lower pyrometer 158. Although the term "ring" is used to describe certain components of the process chamber, such as the pre-heat ring 122, it is contemplated that the shape of these components need not be circular and may include any shape, including but not limited to, rectangles, polygons, ovals, and the like.

The substrate support 123 includes a susceptor plate 124, a substrate support assembly 164, and a substrate lift assembly 160. The substrate support assembly 164 includes a supporting member 134 that supports a backside of the susceptor plate 124 proximate an outer edge thereof. The supporting member 134 may have an outer diameter that is greater than the outer diameter of a substrate to be supported on the susceptor plate 124. The supporting member 134 may substantially cover the backside of the susceptor plate 124. For example, a projection of the supporting member 134 onto the backside of the susceptor plate 124 may cover an area that is greater than 50 percent of the area corresponding to the position of the substrate during processing. In some embodiments, the projection of the supporting member 134 may cover greater than 75 percent, or 90 percent, or 99 percent of the area corresponding to the position of the substrate during processing.

In some embodiments. The supporting member 134 may have a lip 166 formed about an outer edge of the supporting member 134. The lip 166 may be continuously disposed about the outer edge of the supporting member 134. The lip 166 may have a substantially flat upper surface for providing continuous contact with a backside of the susceptor plate 124. Alternatively, the upper surface of the lip 166 may be non-linear (e.g., a curved profile, a square wave profile, a sawtooth wave profile, or the like) for providing periodic contact with a backside of the susceptor plate 124. Alternatively, a plurality of lips 166 may be periodically disposed about the outer edge of the supporting member 134. A backside of the susceptor plate 124 may rest upon the lip 166. In some embodiment, a locating pin or other feature may be provided to locate and interlock the supporting member 134 to the backside of the susceptor plate 124 to prevent the slippage thereof during rotation.

Figure 4A:
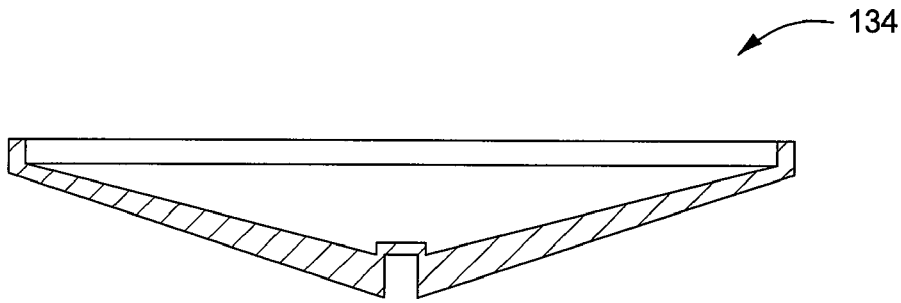
FIGS. 4A-B respectively depict schematic cross-sectional views of supporting members in accordance with some embodiments of the present invention.
Figure 4B:
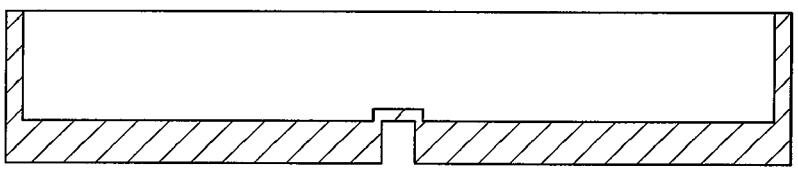

Although the supporting member 134 is shown formed in a conical shape in FIG. 1, the shape need not be conical and may include any shape, including but not limited to, cylinders, polygons, ovals and the like. For example, FIG. 4A depicts a schematic cross-sectional side view of the supporting member 134 having a conical shape. FIG. 4B depicts a schematic cross-sectional side view of the supporting member 134 having a cylindrical shape. Returning to FIG. 1, the supporting member 134 may be one-piece or may be fabricated from multiple pieces. In embodiments where the supporting member 134 is fabricated from multiple pieces, adjacent sections may be coupled together, touching each other, or placed proximate each other while leaving a gap therebetween. In some embodiments, the supporting member 134 may include a plurality of apertures 148, such as holes, slots, or the like. In some embodiments a purge gas, such as nitrogen or the like, may be flowed through the plurality of apertures 148 to purge an inner region between the backside of the susceptor plate 124 and the supporting member 134, thereby preventing undesirable deposition of materials in the inner region.

In some embodiments, the supporting member 134 may be transmissive to radiation that is used to heat the susceptor plate 124. In such embodiments, the supporting member may comprise at least one of clear fused quartz, opaque quartz, or the like. In one embodiment, the supporting member 134 is fabricated from clear fused quartz. In some embodiments, the supporting member 134 may be non-transmissive (e.g., opaque or highly emissive) to radiation that is used to heat the susceptor plate 124. For example, in embodiments where top heating is provided, the supporting member 134 need not be transmissive to the radiation. In such embodiments, the supporting member 134 may comprise silicon carbide, silicon nitride, aluminum nitride, or the like.

The substrate lift assembly 160 comprises a substrate lift shaft 126 and a set of lift pin modules 161 selectively resting on respective pads 127 of the substrate lift shaft 126. Each lift pin module 161 may comprise a lift pin 128 and lift pin holder 129. A lower portion of the lift pin 128 may rest in the lift pin holder 129, where the lift pin holder 129 rests on the pad 127. The lift pin 128 is movably disposed through a first opening 159 in the supporting member 134 and a second opening 162 in the susceptor plate 124. In operation, the substrate lift shaft 126 is moved to engage the lift pins 128. When engaged, the lift pins 128 may contact the back side of a substrate 125 and raise the substrate 125 above the susceptor plate 124 or lower the substrate 125 onto the susceptor plate 124.

Figure 2A:
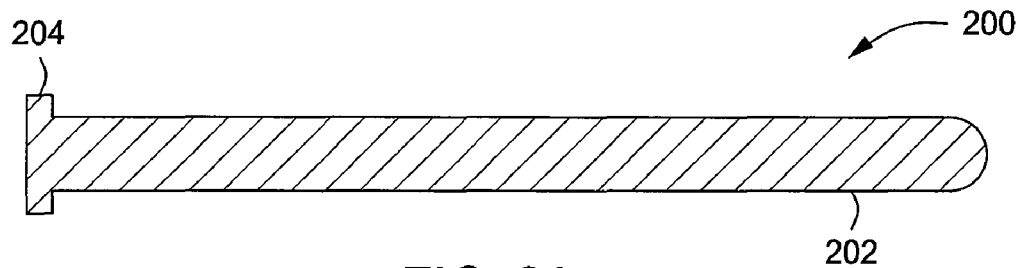
FIGS. 2A-E depict embodiments of a lift pin in accordance with some embodiments of the present invention.

Referring to FIG. 2A-E, embodiments of lift pins suitable for use in the process chamber 100 are provided. For example, one non-limiting embodiment of a lift pin 200 is depicted in FIG. 2A. The lift pin 200 comprises a shaft 202 having a head 204 coupled thereto. The head 200 is configured to contact the backside of the substrate 125 through the opening 162 in the susceptor plate 124. An end of the shaft opposite the head 204 rests in the lift pin holder 129. The lift pins 200 may be formed of materials having different thermal characteristics (e.g., the lift pins 200 may be formed of one of various materials, that when radiated by the one or more lower lamps 154, absorb and/or reflect differing amounts of heat). For example, the lift pins 200 may comprise materials having a low thermal mass—such as at least one of silicon carbide-coated graphite, quartz, alumina, glassy carbon, or the like. Such materials have a thermal mass in the range of between about 1 to about 100 W/mK at room temperature. In some embodiments, the lift pins 200 may comprise materials having a high thermal mass—such as at least one of solid silicon carbide, silicon nitride, aluminum nitride, or the like. Such materials have a thermal mass in the range of between about 100 to about 300 W/mK at room temperature. The materials for the lift pins 200 may be selected, for example, to have higher or lower thermal mass depending on factors including processing conditions and/or chemical composition of a layer being deposited on the substrate. In some embodiments, the thermal mass of each lift pin may be between about 100-200 W/mK.

Figure 2B:
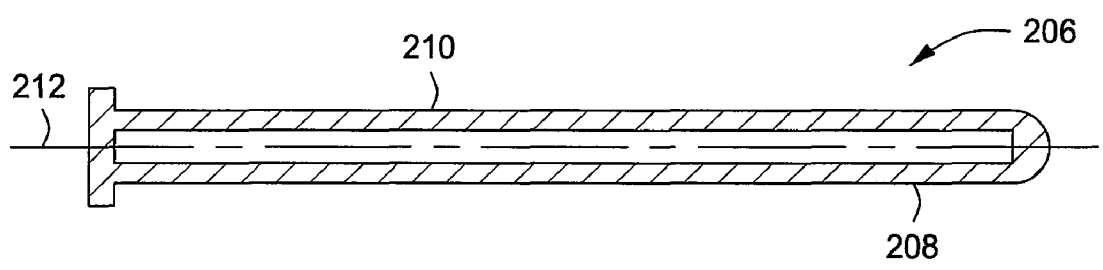

Additionally, in some embodiments, as illustrated in FIG. 2B, a lift pin 206 may include a shaft 208 having a hollow recess 210 disposed along a longitudinal axis 212 of the shaft. For example, the hollow recess 210 may be provided to reduce the thermal mass of the lift pin 206 as compared to a lift pin of the same composition having a solid shaft. The hollow recess 210, although illustrated as extending longitudinal along substantially the entire length of the shaft 208, can be of any suitable configuration designed to alter thermal mass of the lift pin, including and not limited to a hollow recess extending a partial length of a shaft and/or varying in cross section along the length of the shaft.

In addition to the lift pin material selection and the solid or hollow recess configuration, in some embodiments, the head of the lift pin can have a number of configurations. For example, as depicted in FIG. 2A, the head 204 may be flat. In some embodiments, a flat head such as head 204 may utilized to maximize contact with a back side of the substrate. The diameter of the flat head may be sized accordingly to control the surface area in contact with the substrate. In some embodiments, a flat head may have a diameter ranging from about a diameter of the opening 162 in the susceptor plate 124 to about a diameter of a shaft of a lift pin having the flat head disposed thereon.

Figure 2C:
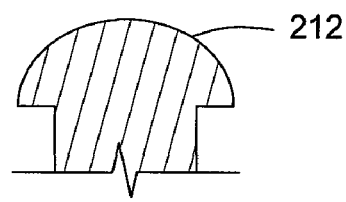
Figure 2D:
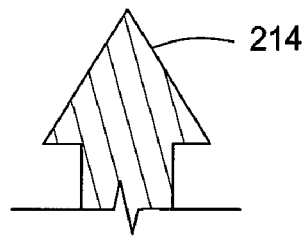
Figure 2E:
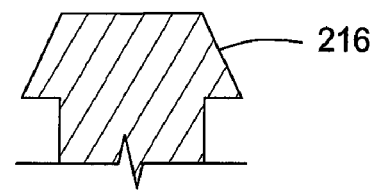

In some embodiments, and as illustrated in FIGS. 2C-E, the shape of a head may include a curved, or convex head 212, a pointed head 214, or a beveled head 216. Other shapes are possible, including any shapes suitable for controlling the surface area of the lift pin in contact with the substrate. Such control may facilitate reducing azimuthal temperature non-uniformity in the substrate proximate a portion of the substrate contacted by, and/or proximate to the lift pins. Accordingly, by selection of the lift pin material, solid or hollow configuration, and/or head geometry, thermal heat transfer between the head of the lift pin and the backside of the substrate may be controlled for different processes, lamp biasing settings, thereby facilitating better control over the thermal uniformity proximate the lift pin sites.

Returning to FIG. 1, and during processing, a substrate 125 is disposed on the susceptor plate 124. The lamps 136, 138, 152, and 154 are sources of infrared (IR) radiation (i.e., heat) and, in operation, generate a pre-determined temperature distribution across the substrate 125. The lid 106, the clamp ring 116, and the lower dome 132 are formed from quartz. However, other IR-transparent and process compatible materials may also be used to form these components. In some embodiments, the lamp 154 provides infrared radiation to the back side of the susceptor plate 124, where the supporting member 134 is transmissive to the infrared radiation provided by the lamp 154. In some embodiments, the lamp 154 provides infrared radiation to each lift pin 128, where each lift pin 128 is configured to limit azimuthal temperature non-uniformity proximate a portion of the substrate 125 disposed above each second opening 162, as discussed below.

The support systems 130 include components used to execute and monitor pre-determined processes (e.g., growing epitaxial silicon films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 generally comprises a central processing unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems. The CPU 142 may be of any form of a general-purpose computer processor used in an industrial setting. Software routines can be stored in the memory 144, which may be random access memory, read only memory, floppy or hard disk, or other form of digital storage. The support circuits 146 are conventionally coupled to the CPU 142 and may comprise cache, clock circuits, input/output sub-systems, power supplies, and the like.

Figures 5A, 5B:
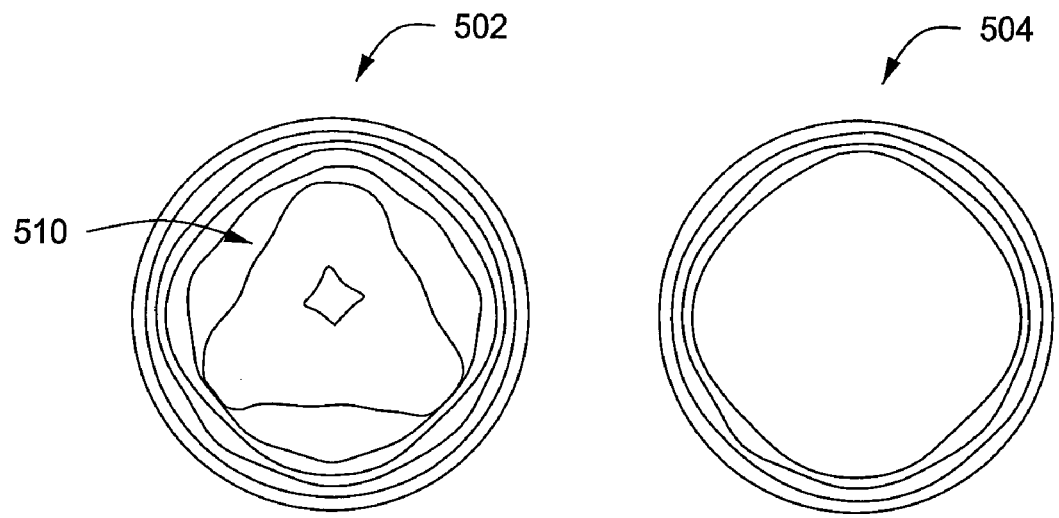
FIGS. 5A-B respectively depict schematic surface temperature uniformity plots of substrate supported by conventional supporting members and by supporting members in accordance with some embodiments of the present invention.

In operation, a substrate may be disposed in the process chamber and, for example, a deposition process may be performed. In some embodiments, a uniformity of a layer of material deposited on the substrate may advantageously be more uniform due to the inventive processing apparatus. For example, local thermal non-uniformities in the substrate caused by support arms of conventional susceptor supports may cause a thermal effect on the substrate, which may undesirably affect temperature-dependent processes. To illustrate this effect, FIGS. 5A-B respectively depict schematic surface temperature uniformity plots of substrate supported by conventional supporting members and by supporting members in accordance with some embodiments of the present invention. As seen in FIG. 5A, a substrate 502 disposed on a susceptor plate having three support arms may have a non-uniform temperature region 510 corresponding to the locations of the support arms. However, as seen in FIG. 5B, a substrate 504 disposed on a susceptor plate having a support member as disclosed herein may have a much more uniform temperature profile, without the non-uniform region seen in FIG. 5A.

In some embodiments, a uniformity of a layer of material deposited on the substrate may be non-uniform due to local thermal non-uniformities in the substrate caused by the lift pins. Depending upon the process, the non-uniformity may be a lesser film thickness or a greater film thickness. Accordingly, in another aspect of the present invention, a method of processing a substrate is provided that may advantageously reduce such film thickness non-uniformities.

Figure 3:
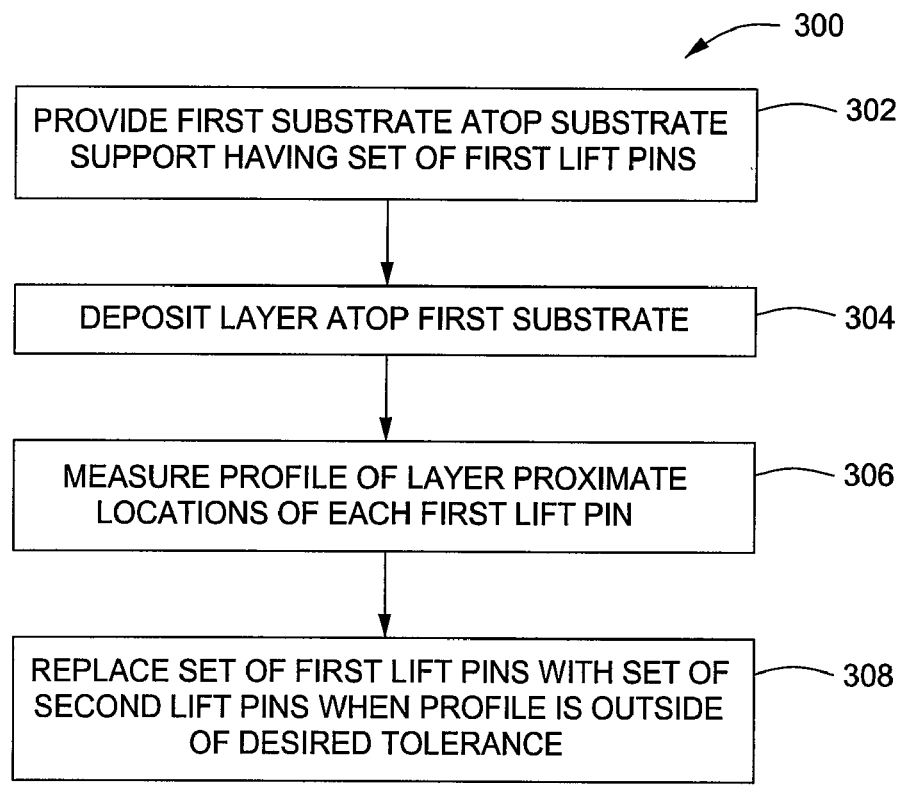
FIG. 3 depicts a flow chart of a method for providing a process gas to a substrate in accordance with some embodiments of the present invention.

For example, FIG. 3 illustrates a process flow chart of a method 300 for processing a substrate. The method 300 may be performed in a deposition chamber, such as the process chamber 100 described above with respect to FIG. 1. Method 300 is described below with respect to the process chamber 100.

The method 300 begins at 302, by providing a first substrate atop the substrate support 123 having a set of first lift pins disposed therein. The set of first lift pins may be selected for having a thermal mass suitable to the processing conditions. For example, and in one non-limiting embodiment, where a layer being deposited requires a high intensity (>90%) of any and/or all of the lamps 136, 138, 152, and 154, the first set of lift pins may be selected in accordance with the embodiments described in FIGS. 2A-E to have a lower thermal mass. Processing conditions that may dictate selection of the first set of lift pins can include one or more of lamp intensity, lamp power distribution (or bias) between sets of lamps in the process chamber (such as upper and lower lamps), the chamber pressure, the composition and/or flow rate of process gases, the temperature sensitivity of the process, or the like.

At 304, a first layer is deposited atop the first substrate using the substrate support 123 having the set of first lift pins. The set of first lift pins may be selected to have a first set of thermal characteristics for facilitating deposition of the first layer with a substantially uniform profile. For example, the set of first lift pins are fabricated from first material, may be solid or hollow, and have a first head geometry. The lift pin material, the solid or hollow configuration, and/or the head geometry may be selected to provide a desired rate of thermal heat transfer between the head of the lift pin and the backside of the substrate.

At 306, a thickness profile of the first layer proximate a location of each first lift pin is measured. The thickness profile may be measured by any suitable process and in any suitable chamber, including in situ. In some embodiments, the process chamber 100 may be part of a cluster tool (not shown) having a metrology chamber coupled thereto for measuring the thickness profile of the first layer. An exemplary cluster tool which may be adapted for the present invention is one of the CENTURA® line of cluster tools, available from Applied Materials, Inc., of Santa Clara, Calif. In some embodiments, the first substrate may be removed from the process chamber 100 and measured by an independent apparatus, for example, a profilometry system, atomic force microscope (AFM), or other suitable apparatus for determining the thickness profile of the first layer.

Alternatively, a temperature profile of the first substrate may be measured. The temperature profile may be measured by any suitable process and in any suitable chamber, including in situ. The temperature profile may be obtained by measuring or calculating the temperature of the backside or the frontside of the substrate, The temperature profile may be utilized in place of the thickness profile where temperature dependent processes are being performed.

In some embodiments, the thickness (or temperature) profile of the first layer (or substrate) may be substantially equivalent to the desired profile or within a desired tolerance. In such embodiments, the method 300 ends at 306, and the substrate support 123 is properly configured to continue depositing layers on substrates using the same processing conditions. The desired tolerance may vary depending on the application. In some embodiments, the desired tolerance of the thickness or temperature profile is between about −10 to about +10 percent.

In some embodiments, the thickness (or temperature) profile of the first layer (or substrate) may be outside of the desired tolerance (e.g., may vary too much proximate the locations of the lift pins). In such embodiments, the method 300 proceeds to 308, where the set of first lift pins is replaced with a set of second lift pins. The set of second lift pins have thermal characteristics that are different than the set of first lift pins. For example, at least one of composition, solid or hollow configuration, or head geometry of the second lift pins is different than the first lift pins. For example, and in one non-limiting embodiment, the set of first lift pins may result in a first layer having a first thickness proximate a location of each first lift pin that is greater than or less than an average thickness of the first layer by an undesirable amount. In such embodiments, the set of first lift pins may be replaced with the set of second lift pins, where each second lift pin may be selected for having a thermal characteristics selected to increase or decrease, as desired, the resultant thickness of the first layer proximate the locations of the second lift pins, for example, to result in a more uniform thickness profile of the first layer in subsequent processes.

Upon selection of a set of second lift pins having appropriate variations from the set of first lift pins, the method may be repeated (e.g., 302, 304, and 306) with the set of second lift pins and a second substrate. The second substrate is typically equivalent in dimension, chemical composition, and patter, to the first substrate. A second layer may be deposited on the second substrate and its thickness (or temperature) measured. If the second layer is determined to have a profile substantially equivalent to the desired profile or within a desired tolerance, then the method 300 ends, else the method 300 may proceed to 308 wherein a set of third lift pins may be selected having thermal characteristics that are different than the sets of first and second lift pins, as discussed above, and the method 300 iterates again with the set of third lift pins and a third substrate. The method 300 may be iterated with additional sets of lift pins until a profile of a deposited layer formed using the set of lift pins is substantially equivalent to the desired thickness profile or with the desired tolerance. The method 300 then ends, and the process chamber 100 and substrate support 123 are configured suitably for depositing layers having the desired thickness profile and within the desired tolerance.

Figure 6:
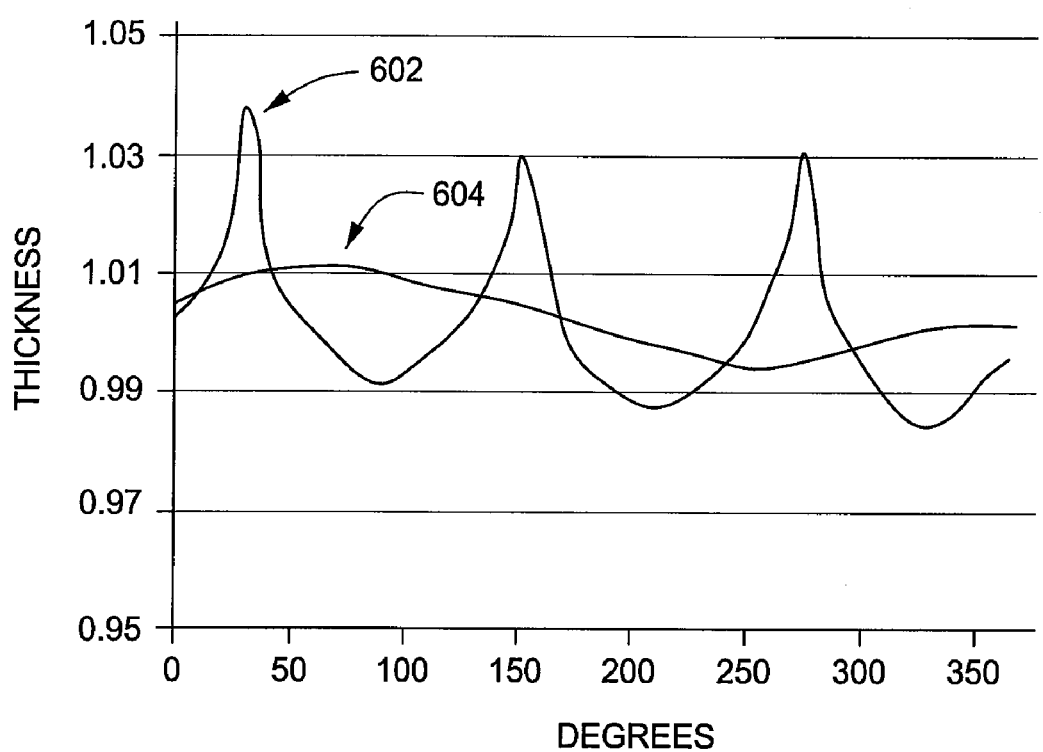
FIG. 6 depicts a schematic graph 600 comparing azimuthal film thickness profiles of substrates processed conventionally and in accordance with some embodiments of the present invention.

For example, FIG. 6 depicts a schematic graph 600 comparing azimuthal film thickness profiles of substrates processed conventionally and in accordance with embodiments of the present invention (such as the method 300 discussed above). Although depicted in a simplified format for ease of understanding, the graph 600 is based upon actual data. FIG. 6 depicts a conventional azimuthal thickness profile 602, and an azimuthal thickness profile 604 corresponding to a substrate processed in accordance with embodiments of the present invention. The profile 602 includes three peaks corresponding to the positions of lift pins in disposed the susceptor plate. However, profile 604 clearly shows a more uniform thickness profile with no peaks in the positions of the lift pins. Thus, substrates processed in accordance with the teachings provided herein may advantageously have a more uniform thickness as compared to conventionally processed substrates.

Thus, methods and apparatus for providing an improved azimuthal thermal uniformity of a substrate have been provided herein. An inventive substrate support includes a conical supporting member which may advantageously provide improved azimuthal temperature uniformity across the back side of a susceptor plate. Thus, azimuthal temperature uniformity across the substrate surface is improved, which may result in improved uniformity of a layer deposited on the substrate surface. An inventive method for configuring the substrate support advantageously reduces local temperature non-uniformities in the substrate proximate the location of each lift pin in the substrate support.

While the foregoing is directed to embodiments of the present invention, other and further embodiments of the invention may be devised without departing from the basic scope thereof, and the scope thereof is determined by the claims that follow.

The invention claimed is:

1. A substrate support for use in a semiconductor process chamber, comprising:
   a susceptor plate; and
   a supporting member to support a backside of the susceptor plate, the supporting member having a contacting portion which contacts the backside of the susceptor plate proximate an outer edge thereof and a non-contacting portion disposed inward of the contacting portion which does not contact the backside of the susceptor plate, wherein the supporting member substantially covers the backside of the susceptor plate.

2. The substrate support of claim 1, wherein the supporting member is transmissive to radiation that is used to heat the susceptor plate.

3. The substrate support of claim 2, wherein the supporting member comprises clear fused quartz.

4. The substrate support of claim 1, wherein the supporting member further comprises a lip disposed about an outer edge of the supporting member, the lip configured to contact the backside of the susceptor plate.

5. The substrate support of claim 1, wherein the supporting member is non-transmissive to radiation that is used to heat the susceptor plate and comprises at least one of opaque quartz, silicon carbide, silicon nitride, or aluminum nitride.

6. The substrate support of claim 1, further comprising:
a lift pin shaft having a set of lift pins disposed thereon and wherein each lift pin is moveably disposed through an first opening in the supporting member and a second opening in the susceptor plate when engaged by the lift pin shaft.

7. The substrate support of claim 6, wherein the lift pins comprise a shaft and a head coupled to the shaft and configured for contacting the backside of a substrate, and wherein the shaft further comprises a hollow recess disposed therein and extending along an axial length thereof.

8. The substrate support of claim 6, wherein the lift pins comprise a shaft and a head coupled to the shaft and configured for contacting the backside of a substrate, and wherein an upper support surface of the head is flat, curved, pointed, or beveled.

9. The substrate support of claim 6, wherein the lift pins comprise at least one of silicon carbide, graphite, quartz, alumina, glassy carbon, silicon nitride, or aluminum nitride.

10. The substrate support of claim 6, wherein a thermal mass of each lift pin is between about 1 and about 300 W/m-K.

11. The substrate support of claim 1, wherein the supporting member further comprises a plurality of apertures formed therethrough.

12. An apparatus for processing a substrate, comprising:
a process chamber; and
a substrate support disposed within the process chamber, the substrate support comprising:
a susceptor plate; and
a supporting member to support a backside of the susceptor plate, the supporting member having a contacting portion which contacts the backside of the susceptor plate proximate an outer edge thereof and a non-contacting portion disposed inward of the contacting portion which does not contact the backside of the susceptor plate, wherein the supporting member substantially covers the backside of the susceptor plate.

13. The apparatus of claim 12, wherein the process chamber further comprises one or more lamps disposed therein, wherein at least some of the lamps are disposed below the supporting member and utilized to heat the backside of the susceptor plate.

14. The apparatus of claim 12, wherein the supporting member comprises at least one of clear fused quartz opaque quartz, silicon carbide, silicon nitride, or aluminum nitride.

15. The substrate support of claim 12, wherein the supporting member further comprises a plurality of apertures formed therethrough.

16. The substrate support of claim 12, further comprising:
a lift pin shaft having a set of lift pins disposed thereon and wherein each lift pin is moveably disposed through an first opening in the supporting member and a second opening in the susceptor plate when engaged by the lift pin shaft.

* * * * *